(12) United States Patent
Samuels

(10) Patent No.: US 12,197,765 B2
(45) Date of Patent: Jan. 14, 2025

(54) TENSOR NON-LINEAR SIGNAL PROCESSING RANDOM ACCESS MEMORY

(71) Applicant: Advanced Energy Industries, Inc., Fort Collins, CO (US)

(72) Inventor: Chad S. Samuels, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 223 days.

(21) Appl. No.: 17/516,578

(22) Filed: Nov. 1, 2021

(65) Prior Publication Data

US 2023/0140542 A1    May 4, 2023

(51) Int. Cl.
*G06F 3/06* (2006.01)
*G06N 3/045* (2023.01)
*G06N 3/063* (2023.01)
*G11C 7/10* (2006.01)
*G11C 11/54* (2006.01)

(52) U.S. Cl.
CPC ................................. *G06F 3/0655* (2013.01)

(58) Field of Classification Search
CPC .............................. G06F 9/4881; G06F 3/0659
See application file for complete search history.

(56) References Cited

U.S. PATENT DOCUMENTS

| | | | |
|---|---|---|---|
| 8,040,068 B2 | 10/2011 | Coumou | |
| 8,258,874 B2 | 9/2012 | van Zyl | |
| 8,716,984 B2 | 5/2014 | Mueller | |
| 8,912,835 B2 | 12/2014 | Nagarkatti | |
| 9,225,299 B2 | 12/2015 | van Zyl | |
| 9,721,758 B2 | 8/2017 | Coumou | |
| 10,049,857 B2 | 8/2018 | Fisk, II | |
| 10,346,093 B1* | 7/2019 | Wu | G06F 3/0659 |
| 2017/0316312 A1 | 11/2017 | Goya et al. | |
| 2017/0339325 A1* | 11/2017 | Dabral | H04N 23/741 |
| 2018/0197907 A1* | 7/2018 | Wada | H04N 25/617 |
| 2019/0371372 A1* | 12/2019 | Kim | G11C 5/145 |
| 2019/0392287 A1* | 12/2019 | Ovsiannikov | G06F 17/153 |
| 2021/0132945 A1* | 5/2021 | Mills | G06F 9/4881 |
| 2021/0271734 A1 | 9/2021 | Mai et al. | |

OTHER PUBLICATIONS

Thomas, Shane, "International Search Report and Written Opinion Issued in International Application No. PCT/US2022/048586", Feb. 7, 2023, pp. 12, Published in: US.

* cited by examiner

*Primary Examiner* — Getente A Yimer
(74) *Attorney, Agent, or Firm* — Neugeboren O'Dowd PC

(57) ABSTRACT

Various illustrative aspects are directed to a system that comprises a tensor data pre-processing circuit and a tensor data write/read circuit. One or more output ports of the tensor data pre-processing circuit are operably coupled to one or more input ports of the tensor data write/read circuit.

20 Claims, 12 Drawing Sheets

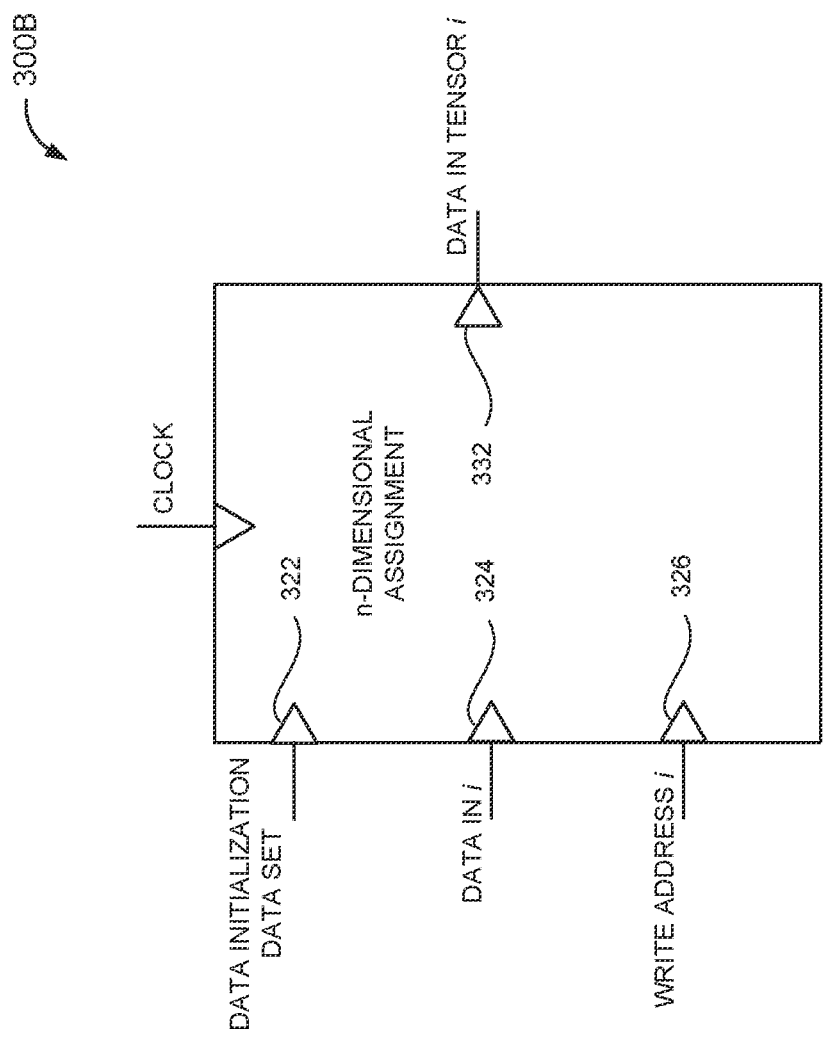

TENSOR NON-LINEAR SIGNAL PROCESSING RANDOM ACCESS MEMORY

TECHNICAL FIELD

Aspects of the present disclosure relate generally to random access memory (RAM), and in particular, RAM well-suited for tensor applications, complex control systems, and other specialized applications.

BACKGROUND

Control systems have important applications in many technology areas, including plasma applications, semiconductor processing and other materials processing, robotics, vehicle control systems for automobiles, aircraft, and spacecraft, and other electronic, manufacturing, and industrial systems. Semiconductor processing and other advanced materials processing rely on increasingly sophisticated plasma processes. Such plasma processes, in turn, require increasingly sophisticated power systems and control systems, to subject inherently unstable and nonlinear plasmas to increasing precision and consistency. Such plasmas are used for processes such as plasma etch processes, plasma-enhanced chemical vapor deposition (CEPVD) processes, plasma-enhanced atomic layer deposition (PEALD) processes, plasma-assisted atomic-layer deposition (PA-ALD), RF sputtering deposition, and other plasma applications.

After substantial technological progress, one typical plasma power and control system may comprise an inductively coupled plasma (ICP) reactor, powered by an RF generator connected through an RF impedance match network, and accompanied by measurement equipment that detects signals and physical states from the match network and the plasma reactor and feeds that data to the RF generator. The match network implements rapid, high-precision matching of the rapidly changing, chaotic, nonlinear impedance of the plasma, to protect the RF generator from the otherwise deleterious effects of those rapid, nonlinear impedance changes. The RF generator amplifies and converts electrical power from a basic input form into a form optimized to power the plasma. The RF generator comprises an RF power amplifier, a user interface, and a controller, such as a measurement and control multi-processor system on chip (M&C MPSoC), which controls the RF generator. Plasma processing systems may be used for various applications, such as semiconductor manufacturing processes and dielectric etch processes, for example.

SUMMARY

This disclosure presents a novel and advantageous tensor non-linear signal processing random-access memory (RAM) systems, architecture, methods, and devices, among other systems, in accordance with various illustrative examples and aspects.

Tensor non-linear signal processing RAM (TNLSP-RAM, or TSP-RAM) systems of this disclosure may be intrinsically well-suited to perform processing in multi-input multi-output (MIMO) systems and to be used in the control of MIMO systems. TSP-RAM systems of this disclosure may be intrinsically well-suited to perform processing for machine learning (ML) and artificial intelligence (AI) software, in data preparation, training, testing, operating, and other major tasks required for ML and AI software development and operation. TSP-RAM systems of this disclosure may be intrinsically well-suited to perform processing in any applications that involve multi-dimensional arrays, vectors, matrixes, or tensors. TSP-RAM systems of this disclosure may enable control systems and control methods with higher performance than prior art systems are capable of.

While some traditional example plasma processing systems, as an example application for TSP-RAM systems of this disclosure, have requirements for one or two states or one or two level pulsing in a setpoint signal provided to a control module of a controller for the plasma processing system, some emerging example systems may have a requirement for four states or four level pulsing, which TSP-RAM systems of this disclosure may accommodate, thereby providing novel advantages in being able to meet requirements for up to four states. For example, emerging plasma processing applications in dielectric etch may be enabled only by four level pulsing, which has not been possible with prior art plasma processing systems. TSP-RAM systems of this disclosure may also, in some examples, be upgradeable or upgraded to be able to provide, for example, up to eight or sixteen states, with a simple software parameter upgrade, with the same hardware. TSP-RAM systems of this disclosure may also be capable of providing more than sixteen states or other numbers of states, in other examples. TSP-RAM systems of this disclosure may use setpoint streaming with multiple desired inputs and multiple desired outputs as part of the desired setpoint waveform, and produce a corresponding MIMO setpoint waveform, as an intrinsic feature of its tensorized nature, as further explained below.

TSP-RAM systems of this disclosure enable multi-dimensional digital signal processing engines. TSP-RAM systems in examples of this disclosure uses novel architecture that may enable performing multi-dimensional digital signal processing in multiple dimensions, in the number of dimensions of tensorized input data, and generate tensor outputs in the same number of dimensions. Novel advantageous aspects such as these may enable TSP-RAM systems in examples of this disclosure to perform multi-dimensional processing without needing to resort to any basis change methods or any other methods to reduce the dimensionality of the processing tasks. Novel advantageous aspects such as these may further enable TSP-RAM systems in examples of this disclosure to perform multi-dimensional processing tasks that are simply not possible in prior art systems or in systems that use basis change methods or that require reduction of dimensionality in order to process. Novel advantageous aspects such as these may contribute to TSP-RAM systems of this disclosure being enabled to perform multi-dimensional digital signal processing in ways that optimize and maximize performance, and minimize resource and timing usage, among other advantages. TSP-RAM systems of this disclosure may enable and process computer software program code that is highly parallelized, that may promote or maximize economies of scale of processing chips, and that lends itself well to present, emerging, and future requirements of various applications, such as machine learning and artificial intelligence (ML/AI) and plasma power supply and plasma processing applications, to name a couple of illustrative example fields of applications.

TSP-RAM systems of this disclosure may enable using and scaling the concept of state up to large and unprecedented numbers of states on applicable state-of-the-art FPGAs, SoCs, and other processing hardware, in various examples. As a couple of indicative illustrative examples, one example TSP-RAM system of this disclosure may enable scaling up to 512 states on one Spartan® 6 FPGA, and up to 65,536 states on one Zynq® 7020 SoC, both available from Xilinx, Inc. of San Jose, California. Further, in various examples, TSP-RAM systems of this disclosure may enable an infinite amount of states, with intrinsic scalability, where the number of states is limited only by the available processing hardware.

TSP-RAM systems in examples of this disclosure may be programmed once, and placed in a realtime processor, such as an FPGA, and can be used in any project or application, regardless of the number of states needed. TSP-RAM systems in examples of this disclosure may thus enable states and numbers of states to be customized by a simple option selection in software, rather than requiring lengthy design cycles. Further novel aspects and advantages are described below.

Various illustrative aspects are directed to a system that comprises a tensor data pre-processing circuit and a tensor data write/read circuit. One or more output ports of the tensor data pre-processing circuit are operably coupled to one or more input ports of the tensor data write/read circuit.

Various illustrative aspects are directed to a method that comprises pre-processing, by a tensor data pre-processing circuit of a tensor non-linear signal processing random access memory (TSP-RAM) system, tensor data. The method further comprises communicating, by the tensor data pre-processing circuit, the pre-processed tensor data to a tensor data write/read circuit of the TSP-RAM system. The method further comprises processing, by the tensor data write/read circuit, the pre-processed tensor data; and outputting, by the tensor data write/read circuit, the processed tensor data.

Various illustrative aspects are directed to an integrated circuit that comprises a tensor data pre-processing circuit and a tensor data write/read circuit. One or more output ports of the tensor data pre-processing circuit are operably coupled to one or more input ports of the tensor data write/read circuit.

Various further aspects are depicted in the accompanying figures and described below, and will be further apparent based thereon.

BRIEF DESCRIPTION OF THE DRAWINGS

Various features and advantages of the technology of the present disclosure will be apparent from the following description of particular examples of those technologies, and as illustrated in the accompanying drawings. The drawings are not necessarily to scale; the emphasis instead is placed on illustrating the principles of the technological concepts. In the drawings, like reference characters may refer to the same parts throughout the different views. The drawings depict only illustrative examples of the present disclosure, and are not limiting in scope.

FIG. 3B illustrates an example n-dimensional assignment circuit, which is analogous in some ways to the n-dimensional assignment circuit of FIG. 3A except in a different functional configuration of input ports and output ports, in a conceptual architectural implementation circuit diagram, in accordance with illustrative aspects of the present disclosure.

DETAILED DESCRIPTION

Aspects of the present disclosure may provide novel and advantageous tensor non-linear signal processing random-access memory (RAM) systems, architecture, methods, and devices, among other systems, in accordance with various illustrative examples and aspects.

Figure 1:
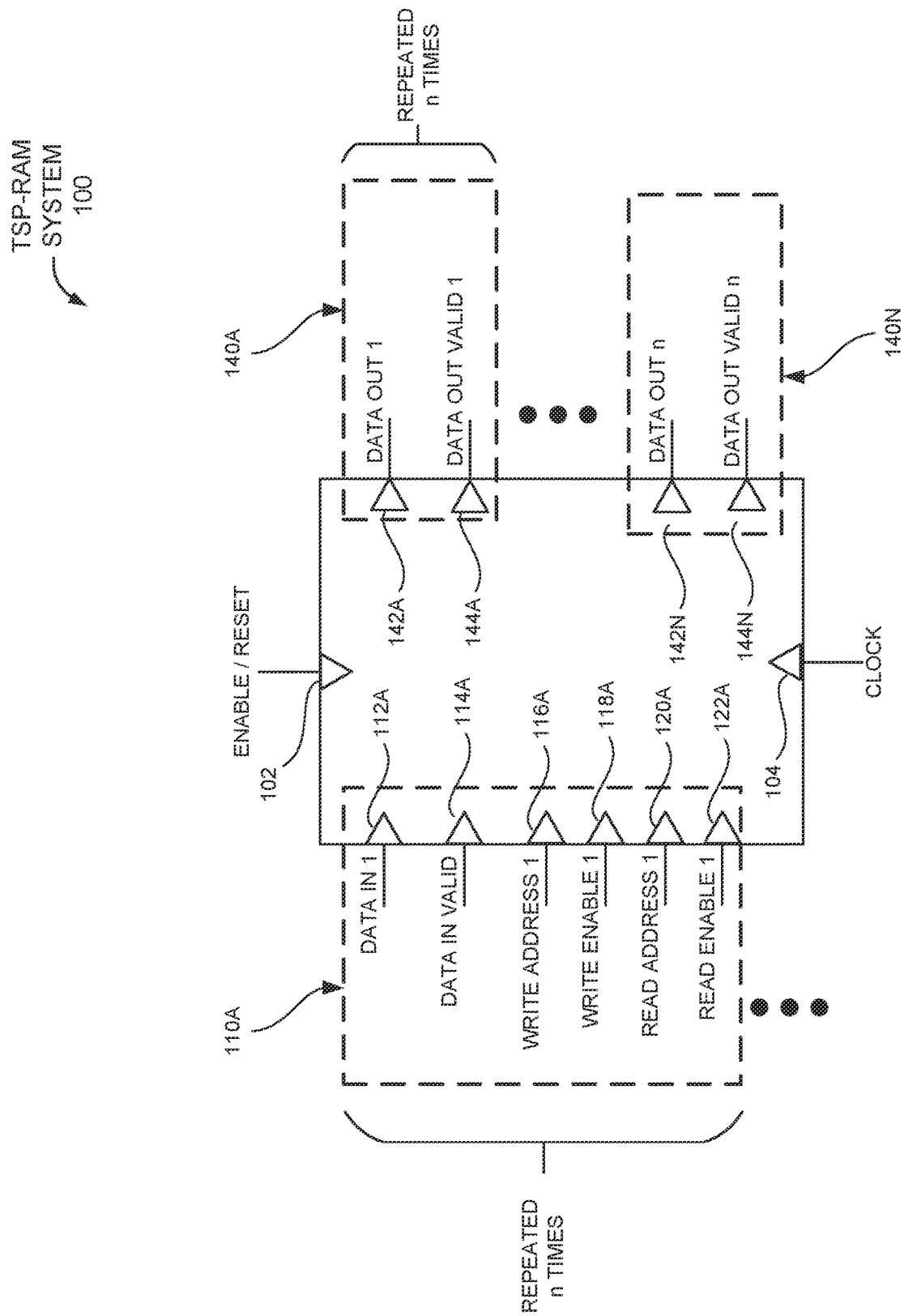
FIG. 1 illustrates an example circuit architecture of a TSP-RAM system in a high-level, conceptual implementation circuit diagram, in accordance with illustrative aspects of the present disclosure.

FIG. 1 illustrates an example circuit architecture of a TSP-RAM system 100 in a high-level, conceptual implementation circuit diagram, in accordance with illustrative aspects of the present disclosure. TSP-RAM system 100 comprises a number n of data input sets, of which only the first example data input set is depicted, and n data output sets, of which only the first and nth data output sets are depicted. The input data and the output data may be in the form of tensors, and TSP-RAM system 100 is configured to receive input data in the form of tensor entities, and to generate the output data in the form of tensors. Example data input set 1, in which each element is indexed to the index number 1 out of the n sets, comprises a data in 1 line, a data in valid 1 line, a write address 1 line, a write enable 1 line, a read address 1 line, and a read enable 1 line. Each of the lines is connected to an input pin of TSP-RAM system 100. Each of the other n data input sets (not depicted in FIG. 1) may comprise its own corresponding set of input ports and input lines, with its own index number i between 1 and n.

Example data output set 1 comprises a data out 1 line and a data out valid 1 line. Each of the other n data output sets (not depicted in FIG. 1, other than data output set n) may comprise its own corresponding set of output ports and output lines, with its own index number i between 1 and n, each output line connected to its own output port or output pin in TSP-RAM system 100. TSP-RAM system 100 also includes input ports or input pins connected to an enable/reset input line and a clock input line, in this example.

Figure 2:
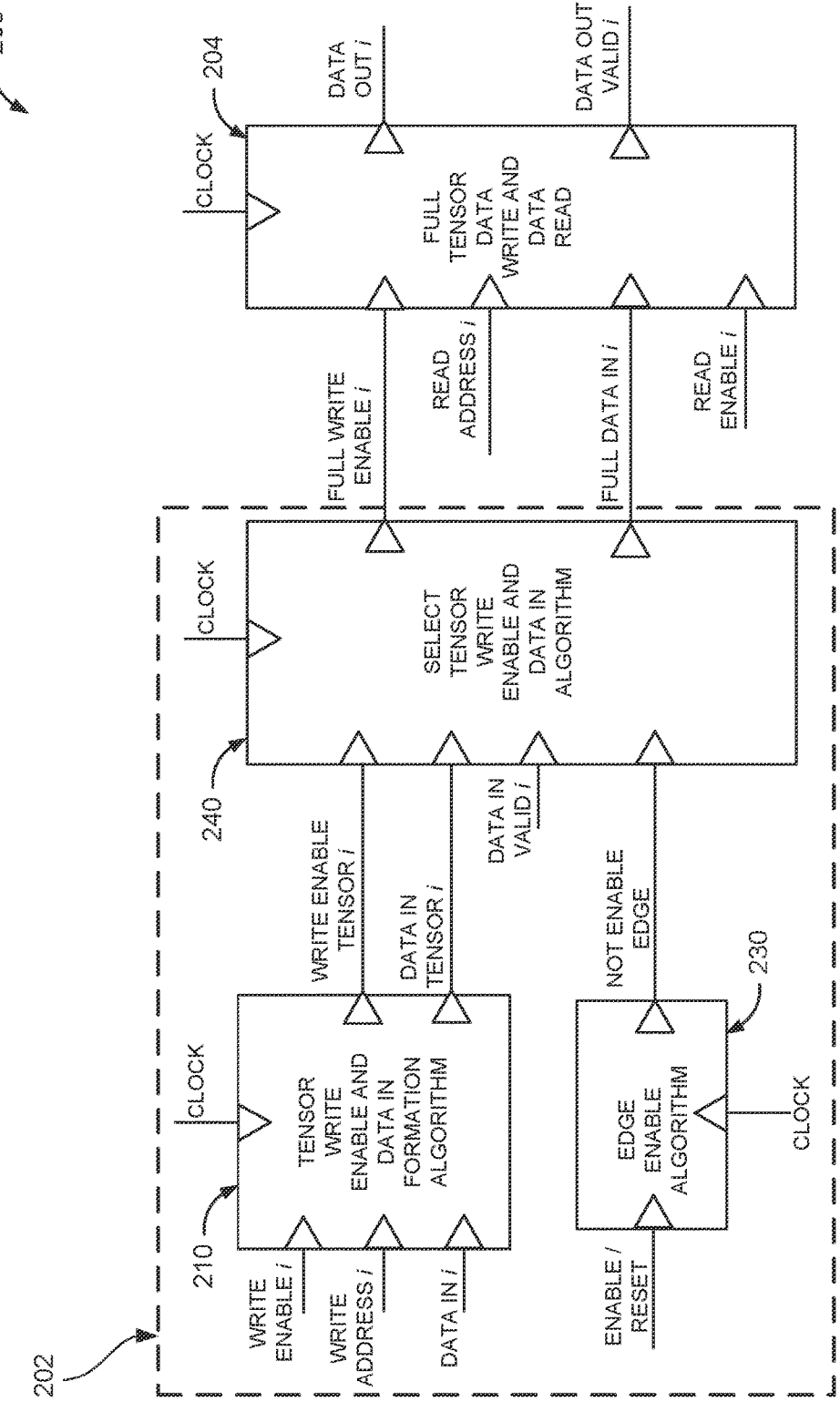
FIG. 2 illustrates an example individual internal tensor processing circuit of a TSP-RAM system, in a high-level, conceptual architectural implementation circuit diagram, in which the tensor processing circuit is configured for processing a single tensorial entity, in accordance with illustrative aspects of the present disclosure.

FIG. 2 illustrates an example individual internal tensor processing circuit 200 of a TSP-RAM system, in a high-level, conceptual architectural implementation circuit diagram, in which tensor processing circuit 200 is configured for processing a single tensorial entity, in accordance with illustrative aspects of the present disclosure. Tensor processing circuit 200 may be an example of a TSP-RAM system 100 as in FIG. 1. Tensor processing circuit 200 may be comprised in TSP-RAM system 100 of FIG. 1, which may comprise a very large number of individual internal tensor processing circuits, of which tensor processing circuit 200 is an illustrative example. As shown, tensor processing circuit 200 shares a subset of input lines and output lines with TSP-RAM system 100 of FIG. 1, as further described below.

Tensor processing circuit 200 comprises a number of processing circuit components. At the highest level, the circuit components of tensor processing circuit 200 may be categorized as a tensor data pre-processing circuit 202 and a tensor data write/read circuit 204. Tensor data pre-processing circuit 202 comprises a tensor write enable and data in formation algorithm processing circuit 210, an edge enable algorithm processing circuit 220, and a select tensor write enable and data in algorithm processing circuit 240. One or more output ports of select tensor write enable and data in algorithm processing circuit 240 are operably coupled to one or more input ports of tensor data write/read circuit 204.

As shown in FIG. 2, tensor write enable and data in formation algorithm processing circuit 210, select tensor write enable and data in algorithm processing circuit 240, and tensor data write i read circuit 204 are each depicted with a number of input ports and output ports that are indexed (indicated with an index variable i), indicating that each indexed input port and output port is a single illustrative example of a plurality, and potentially very large numbers, of such input ports or output ports comprised in the respective circuit; and only a single illustrative example is depicted for the sake of simplicity and clarity in the conceptual diagram of FIG. 2. One or more output ports of tensor write enable circuit and data in formation algorithm processing circuit 210 may be operably coupled to one or more input ports of select tensor write enable and data in algorithm processing circuit 240. Illustrative example implementations of tensor write enable and data in formation algorithm processing circuit 210 are depicted and described in further detail in FIGS. 3A and 3B, below. An illustrative example implementation of edge enable algorithm processing circuit 220 is depicted and described in further detail in FIG. 4, below. Illustrative example implementations of example individual select tensor write enable and data in processing circuit 240 are depicted and described in further detail in FIGS. 5A and 5B, below.

Tensor data write/read circuit 204 is configured to receive one or more full data in inputs; receive one or more full write enable inputs; receive one or more write and/or read addresses; output one or more data out outputs; and output one or more data out valid outputs. An illustrative example implementation of tensor data write/read circuit 204 is depicted and described in further detail in FIG. 6, below. Further details of tensor processing circuit 200 as shown in FIG. 2 will be apparent from the depictions of the further figures and the accompanying descriptions below.

Figure 3A:
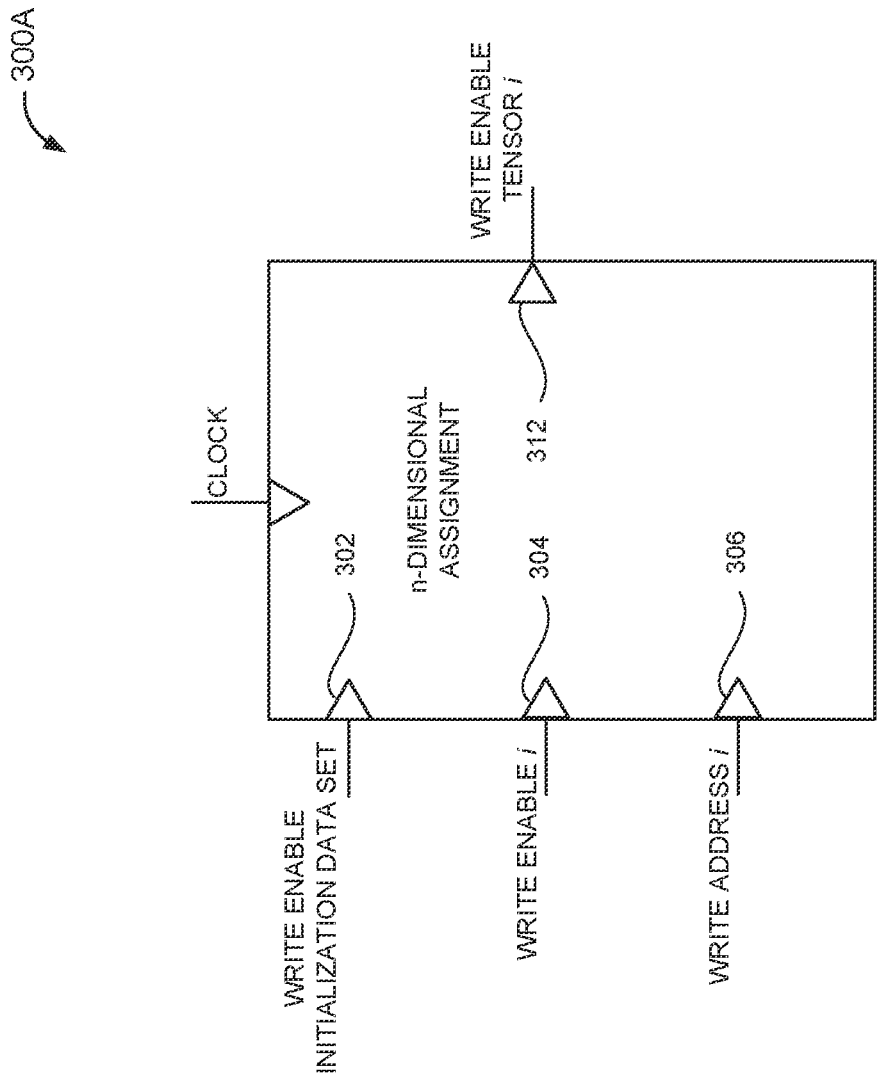
FIG. 3A illustrates an example individual internal n-dimensional assignment circuit, in a conceptual architectural implementation circuit diagram, where n may be the dimension of the tensor data in a tensor to be processed, in accordance with illustrative aspects of the present disclosure.

FIG. 3A illustrates an example individual internal n-dimensional assignment circuit 300A, in a conceptual architectural implementation circuit diagram, where n may be the dimension of the tensor data in a tensor to be processed, in accordance with illustrative aspects of the present disclosure. FIG. 3B illustrates an example n-dimensional assignment circuit 300B, which is analogous in some ways to n-dimensional assignment circuit 300 of FIG. 3A except in a different functional configuration of input ports and output ports, in a conceptual architectural implementation circuit diagram, in accordance with illustrative aspects of the present disclosure. n-dimensional assignment circuits 300A and 300B may be components comprised in tensor write enable and data in formation algorithm processing circuit 210, in various examples. n-dimensional assignment circuits 300A and 300B may collectively be referred to as tensor write enable and data in formation algorithm processing circuit 300, as in the unitary depiction of the analogous tensor write enable and data in formation algorithm processing circuit 210 of FIG. 2, or simply as n-dimensional assignment circuits 300. Tensor write enable and data in formation algorithm processing circuit 210 may comprise a very large number of n-dimensional assignment circuits 300, in various examples.

Each respective n-dimensional assignment circuit 300 may comprise a combined, multiplexed set of n 1-dimensional assignment circuits, in various examples. Each respective n-dimensional assignment circuit 300 may write an n-dimensional input received via its respective second (i.e. center left) input line for index i at a time k to a write address given by an input received via its respective third (i.e. lower left) input line for index i at time k. Thus, specifically, n-dimensional assignment circuit 300A may write, via outputting via indexed write enable tensor i output port 312, an n-dimensional input received via indexed write enable i input port 304 for index i at a time k, to a write address given by an input received via indexed write address i input port 306 for index i at time k. And analogously, n-dimensional assignment circuit 300B may write, via outputting via indexed data in tensor i output port 332, an n-dimensional input received via indexed data in i input port 324 for index i at a time k, to a write address given by an input received via indexed write address i input port 326 for index i at time k.

Each n-dimensional assignment circuit 300 may receive respective initialization data sets as inputs via its respective first (i.e. upper left) input port, which may correspond to sets of initial values for TSP-RAM system 100 of FIG. 1. Thus, specifically, n-dimensional assignment circuit 300A may receive write enable initialization data sets via write enable initialization data set input port 302, and n-dimensional assignment circuit 300B may receive data in initialization data sets via data in initialization data set input port 322. The initialization data set inputs that n-dimensional assignment circuits 300 receive via their respective initialization data set input lines 302, 322 may correspond to sets of initial values for TSP-RAM system 100 of FIG. 1. At every reset, the data may be initialized to the initialization data sets (see further explanation below).

Thus, n-dimensional assignment circuit 300A of tensor write enable and data in formation algorithm processing circuit 300 is configured to: receive write enable inputs; perform n-dimensional tensor assignment to the write enable inputs, thereby generating n-dimensional write enable tensor outputs based at least in part on the write enable inputs; and output the n-dimensional write enable tensor outputs. Analogously, n-dimensional assignment circuit 300B of tensor write enable and data in formation algorithm processing circuit is configured to: receive data in inputs; perform n-dimensional tensor assignment to the data in inputs, thereby generating n-dimensional data in tensor outputs based at least in part on the data in inputs; and output the n-dimensional data in tensor outputs.

Figure 4:
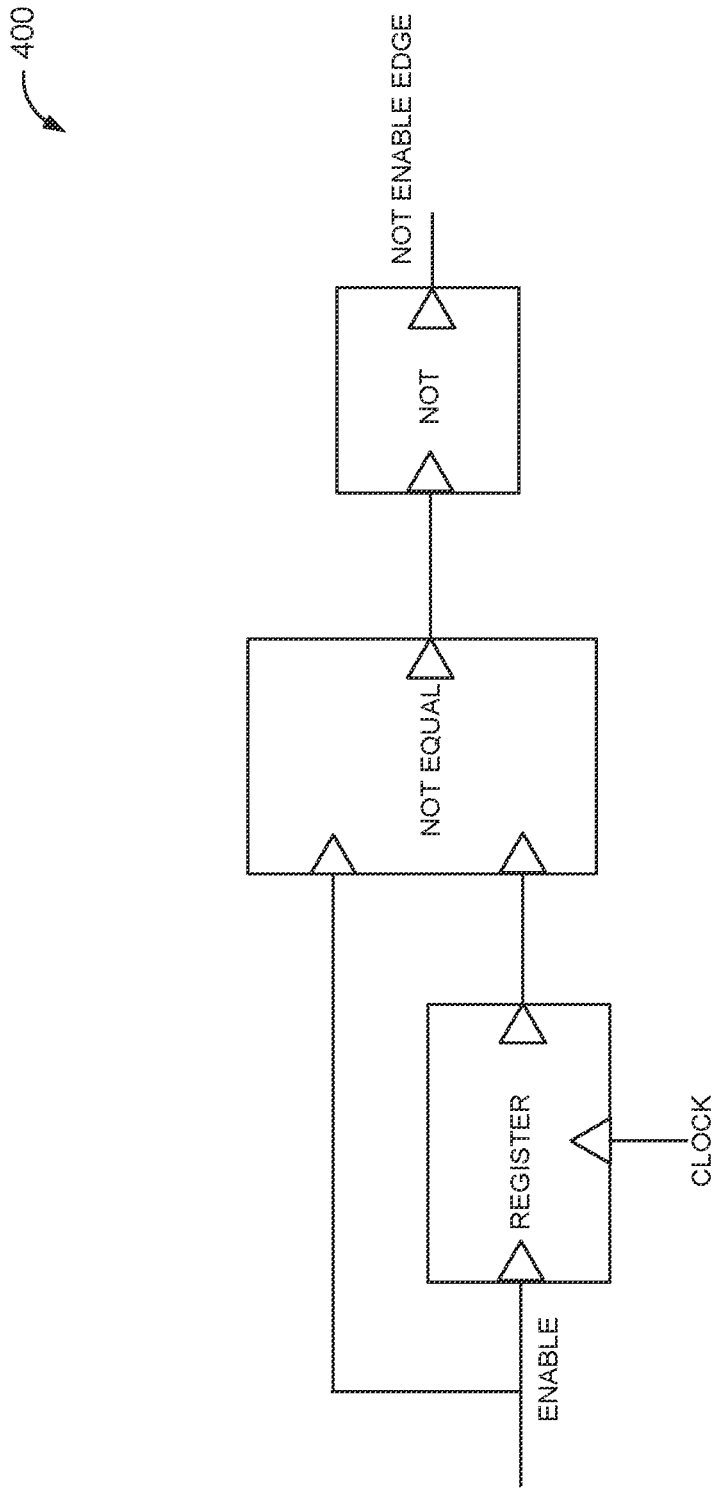
FIG. 4 illustrates an example individual internal edge enable algorithm processing circuit, in a conceptual architectural implementation circuit diagram, in accordance with illustrative aspects of the present disclosure.

FIG. 4 illustrates an example individual internal edge enable algorithm processing circuit 400, in a conceptual architectural implementation circuit diagram, in accordance with illustrative aspects of the present disclosure. Edge enable algorithm processing circuit 400 may be an implementation of edge enable algorithm processing circuit 220 of FIG. 2, or of an illustrative component circuit comprised therein, in accordance with illustrative examples. One or more output ports of edge enable algorithm processing circuit 400 may be operably coupled to one or more input ports of select tensor write enable and data in algorithm processing circuit 500 (i.e., select circuits 500). Example implementations of edge enable algorithm processing circuit 400 may provide not enable edge outputs to confirmation circuits and confirmation output ports of select circuits 500, as described below.

Figure 5A:
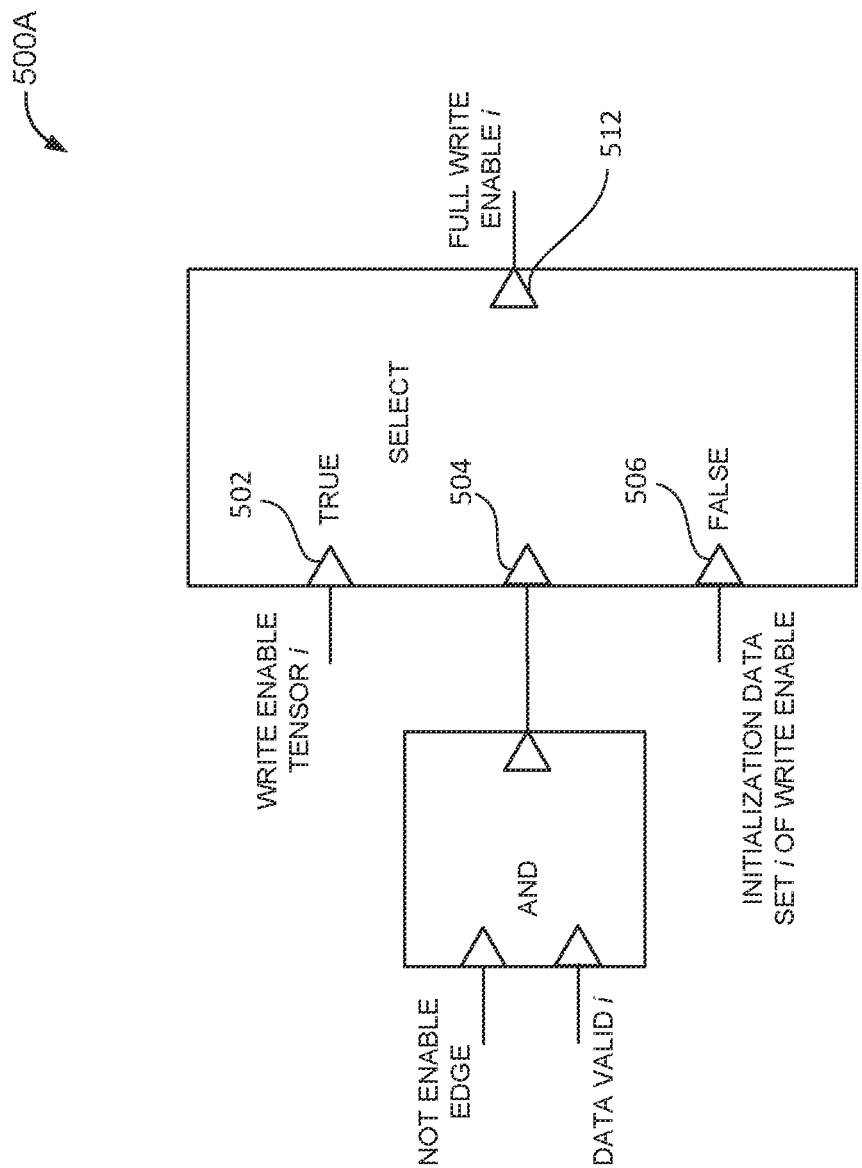
FIG. 5A illustrates an example individual select tensor write enable processing circuit, in a conceptual architectural implementation circuit diagram, in accordance with illustrative aspects of the present disclosure.
Figure 5B:
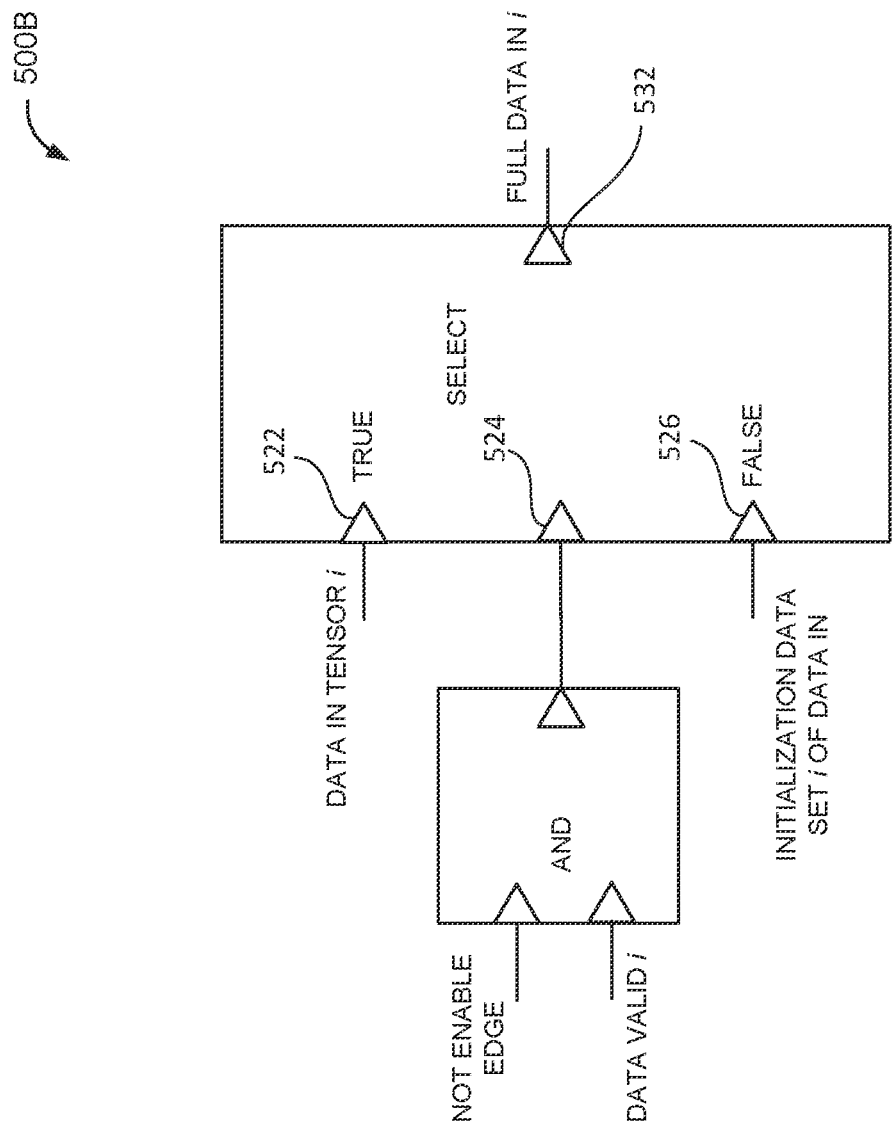
FIG. 5B illustrates an example individual select data in algorithm processing circuit, in a conceptual architectural implementation circuit diagram, in accordance with illustrative aspects of the present disclosure.

FIG. 5A illustrates an example individual select tensor write enable processing circuit 500A, in a conceptual architectural implementation circuit diagram, in accordance with illustrative aspects of the present disclosure. FIG. 5B illustrates an example individual select data in algorithm processing circuit 500B, in a conceptual architectural implementation circuit diagram, in accordance with illustrative aspects of the present disclosure. Select tensor write enable processing circuit 500A and select data in algorithm processing circuit 500B may collectively be referred to as select tensor write enable and data in algorithm processing circuit 500 (as in the unitary depiction of the analogous circuit in FIG. 2), or simply as select circuits 500. Select circuits 500 may be implementations of circuit components comprised in select tensor write enable and data in algorithm processing circuit 240 of FIG. 2, in accordance with illustrative examples. Select tensor write enable and data in algorithm processing circuit 240 of FIG. 2 may comprise very large numbers of both select tensor write enable processing circuit 500A and select data in algorithm processing circuit 500B, in various examples.

As implied by their depictions in FIGS. 5A and 5B, select circuits 500 may pass through signals in accordance with the following logic: if the inputs received via their respective second input ports (i.e. center left) are set to logical true, then select circuits 500 output via their output ports the input received via their first (i.e. upper left) input port; or else, then select circuits 500 output via their output ports the input received via their third (i.e. lower left) input port. That is, for the respective select circuits 500 specifically: for select tensor write enable processing circuit 500A, if the inputs received via confirmation input port 504 are set to logical true, then select tensor write enable processing circuit 500A may respond by outputting, via indexed full write enable i output port 512, the input that select tensor write enable processing circuit 500A receives via indexed write enable i input port 502. Otherwise, select tensor write enable processing circuit 500A may respond by outputting, via indexed full write enable i output port 512, the input received via indexed write enable initialization data set i input port 506. Analogously, for select data in algorithm processing circuit 500B, if the inputs received via confirmation input port 524 are set to logical true, then select data in algorithm processing circuit 500B may respond by outputting, via indexed full data in i output port 532, the input that select data in algorithm processing circuit 500B receives via indexed data in i input port 522. Otherwise, select data in algorithm processing circuit 500B may respond by outputting, via indexed full data in i output port 532, the input received via indexed data in initialization data set i of input port 526.

Thus, select tensor write enable processing circuit 500A of select tensor write enable and data in algorithm processing circuit 500 is configured to: receive one or more write enable tensor inputs; receive one or more write enable initialization data sets; receive a condition indicative input that indicates whether or not a not enable edge condition and a data valid condition are both fulfilled; in response to the condition indicative input indicating that the not enable edge condition and the data valid condition are both fulfilled, output one or more full write enable outputs based at least in part on the one or more write enable tensor inputs; and in response to the condition indicative input indicating that the not enable edge condition and the data valid condition are not both fulfilled, output the one or more write enable initialization data sets. Select data in algorithm processing circuit 500B of select tensor write enable and data in algorithm processing circuit 500 is configured to: receive one or more data in tensor inputs; receive one or more data in initialization data sets; receive a condition indicative input that indicates whether or not a not enable edge condition and a data valid condition are both fulfilled; in response to the condition indicative input indicating that the not enable edge condition and the data valid condition are both fulfilled, output one or more full data in outputs based at least in part on the one or more data in tensor inputs; and in response to the condition indicative input indicating that the not enable edge condition and the data valid condition are not both fulfilled, output the one or more data in initialization data sets.

FIGS. 5A and 5B show the mechanisms that select circuits 500 may use to reset the tensor memory for each tensor i. Select circuits 500 thus enable various example tensor RAM systems of this disclosure to be modified very swiftly in realtime, thereby helping to enable applicability to many inputs in MIMO system applications, and to fast, nanoscale realtime systems applications.

Figure 6:
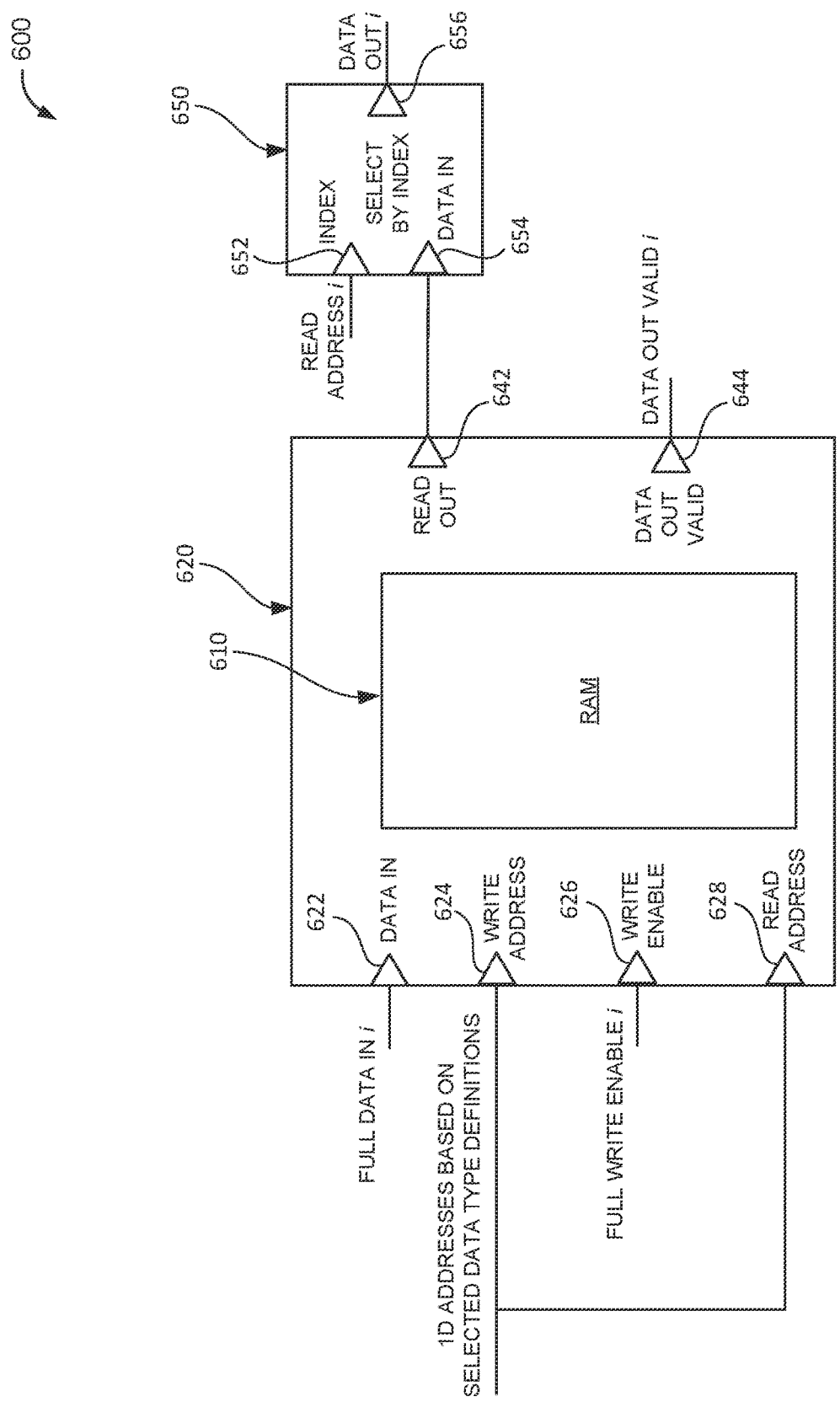
FIG. 6 illustrates an example full tensor data write and data read circuit, in a conceptual architectural implementation circuit diagram, in accordance with illustrative aspects of the present disclosure.

FIG. 6 illustrates an example full tensor data write and data read circuit 600, in a conceptual architectural implementation circuit diagram, in accordance with illustrative aspects of the present disclosure. Full tensor data write and data read circuit 600 may be an illustrative example implementation of full tensor data write and data read circuit 260 of FIG. 2. Full tensor data write and data read circuit 600 comprises a RAM circuit 610, a RAM tensor adaptor circuit 620, and a select by index circuit 650. RAM circuit 610 may comprise a dual port, one-dimensional (1D)/scalar RAM circuit, in various examples.

RAM tensor adaptor circuit 620 comprises RAM circuit 610, and is configured to output one or more read out outputs to select by index circuit 650. Select by index circuit 650 is configured to receive the one or more read out outputs from RAM tensor adaptor circuit 620; receive one or more read address inputs; and output one or more data out outputs.

RAM tensor adaptor circuit 620 comprises a data in input port 622, a write address input port 624, a write enable input port 626, a read address input port 628, a read out output port 642, and a data out valid output port 644. Data in input port 622 is operably coupled to an indexed full data in i input line. Write enable input port 626 is operably coupled to an indexed full write enable i input line. Write address input port 624 and read address input port 628 are operably coupled to address input lines, and may be configured to receive one-dimensional addresses based on selected data type definitions.

RAM tensor adaptor circuit 620 may process tensor data received via full data in input port 622 to convert the tensor data into 1D or scalar data for RAM circuit 610 to process, and then process the resulting scalar data from RAM circuit 610 back into tensor data, to output via read out output port 642. Read out output port 642 of RAM tensor adaptor circuit 620 may be operably connected to data in input port 654 of select by index circuit 650. Select by index circuit 650 also comprises a read address i input port 652. Select by index circuit 650 may thus use a tensor address received via read address i input port to extract tensor data from RAM circuit 610 and RAM tensor adaptor circuit 620.

Figure 7:
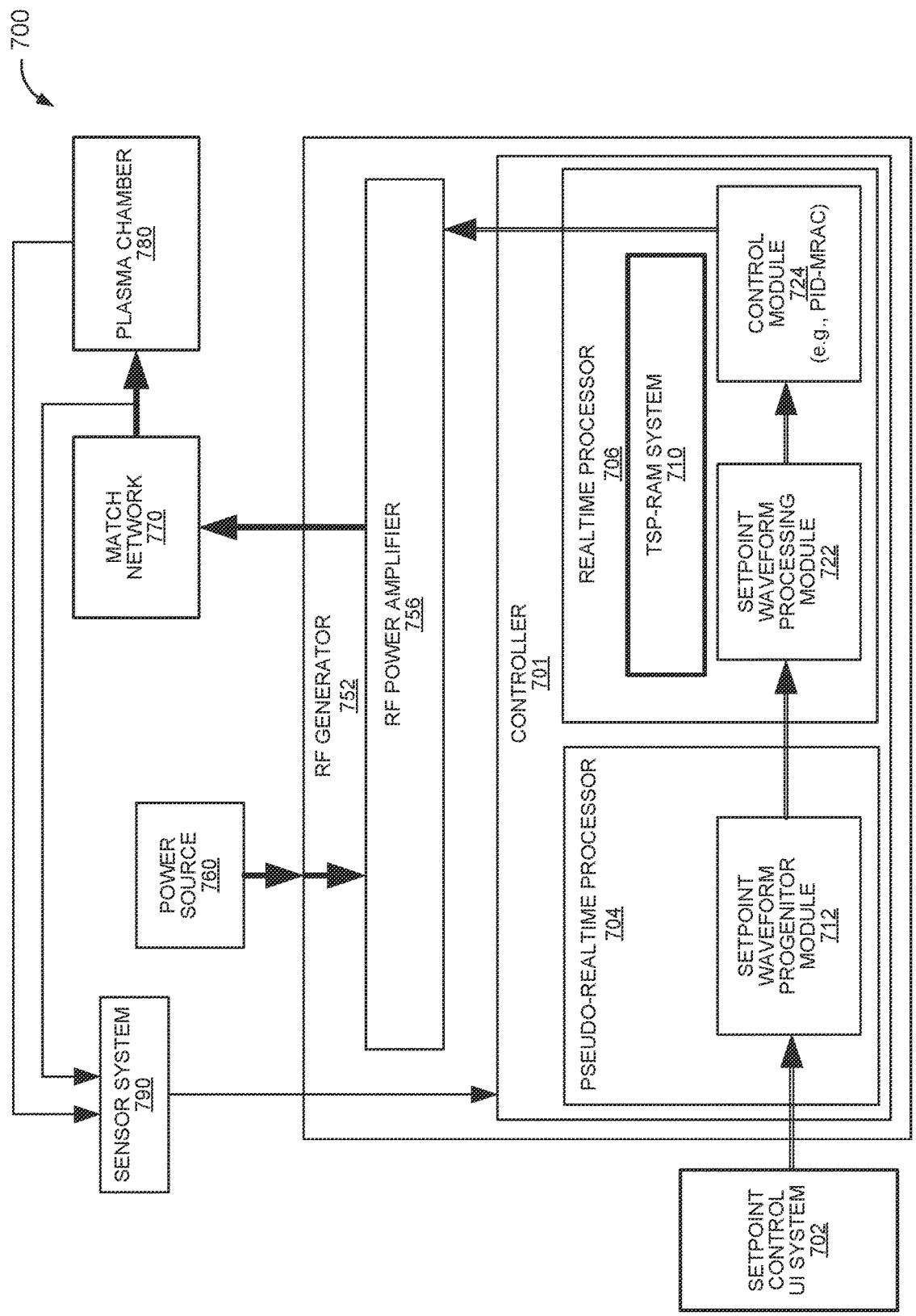
FIG. 7 illustrates a conceptual block diagram of an example plasma processing system, incorporating a controller which comprises a TSP-RAM system of this disclosure, in accordance with illustrative aspects of this disclosure.

FIG. 7 illustrates a conceptual block diagram of an example plasma processing system 700, incorporating a controller 701 which comprises a TSP-RAM system 710 of this disclosure, in accordance with illustrative aspects of this disclosure. Plasma processing system 700 may be one illustrative example of an application in which an example TSP-RAM system of this disclosure may be advantageously deployed and incorporated, and in which TSP-RAM system 710 of this disclosure may enable novel and advantageous functions and capabilities of the entire plasma processing system 700, that have never been available in any prior art plasma processing systems. Plasma processing system 700 is only one illustrative example, among a great many, of an application in which an example TSP-RAM system of this disclosure may be advantageously used. The example of FIG. 7 provides useful context for a TSP-RAM system comprised as part of a controller for a plasma processing system, which is further detailed in FIG. 8 and in the description below with reference thereto.

Plasma processing system 700 comprises a radio frequency (RF) generator 252 which incorporates an RF power amplifier 756 and a controller 701. Controller 701 comprises a pseudo-realtime processor 704 (e.g., a CPU; see further description below) and a realtime processor 706 (e.g., an FPGA; see further description below). Realtime processor 706 comprises a control module 724, which comprises TSP-RAM system 710. Control module 724 may be implemented as a proportional-integral-derivative model-reference adaptive control (PID-MRAC) control module, or in many other implementation types, in various examples (see further description below). Pseudo-realtime processor 704 also comprises a setpoint waveform progenitor module 712, and realtime processor 706 also comprises a setpoint waveform processing module 722. More details on plasma processing system 700 and controller 701 in various illustrative examples may be found in patent application Ser. No. 17/509,539, filed Oct. 25, 2021, and with identical applicant and inventor as the present disclosure.

For purposes of this description, the term "realtime" may be generally interpreted as is familiar in the applicable engineering fields of art, and also may include applicability to a "realtime processor" as a processor that is routinely capable of processing instructions and reacting to inputs with reaction times typical of an FPGA, in some examples, or that are effectively "instantaneous" or realtime as understood in applicable engineering usage in terms of an application in which the processor is applied. As one non-limiting, illustrative example, an FPGA in a control system for a plasma processing system may effectively be a "realtime processor," in terms of being able to process inputs and react to changing conditions on short and effective timescales relative to the often rapidly changing conditions of a plasma in a plasma processing chamber. As another, non-limiting example, a processor that processes and reacts to inputs on time scales in the hundreds or tens of nanoseconds or single-digit nanoseconds or faster, may be considered a "realtime" processor, in various examples. In some examples, a "realtime" processor may also be contrasted with the operations of a CPU, and the time scales of processing instructions and reacting to inputs with reaction times typical of a CPU, within the bounds of ordinarily available or routinely affordable or feasible CPU technology at the time of filing this disclosure, which may not be capable of the same level of timely or "realtime" responsiveness as an FPGA. The term "realtime processor" as used in this disclosure thus would also not exclude a CPU or other non-FPGA type of processing chip that has performance and reaction time capabilities sufficiently beyond those of ordinary CPUs commonly and feasibly applied in the types of applications described herein, at the time and present state of the art of filing this disclosure. The terms "realtime" and "instantaneous" as used herein are thus also expressly not limited to how those terms might be interpreted by a purist physicist, as physically impossible for any technology, as opposed to their ordinary interpretation by engineers skilled in the applicable fields of art, as effectively realtime for engineering purposes in the application at hand.

Plasma processing system 700 further comprises power source 760, match network 770, plasma chamber 780, and sensor system 790, in this example. Plasma processing system 700 shows an example application context in which various example TSP-RAM systems of this disclosure may provide novel advantages. In various examples, controller 701 may be configured to benefit from the novel advantages of TSP-RAM system 710 to generate and output tensor control signals based on tensor inputs, with novel capabilities, as presented in this disclosure, and to output those control signals to drive RF power amplifier 756, thereby to control RF power outputted by RF power amplifier 756 to the RF load comprising match network 770 and plasma chamber 780.

Controller 701 incorporates pseudo-realtime processor 704 and realtime processor 706, which are operably connected together. Pseudo-realtime processor 704 may be, e.g., a CPU in some examples, and realtime processor 706 may be, e.g., an FPGA in some examples, which comprises TSP-RAM system 710. Pseudo-realtime processor 704, realtime processor 706, and TSP-RAM system 710 may be comprised in a single, integrated processing chip, together with integrated interconnecting communication channels or communication fabric, in some examples. Pseudo-realtime processor 704 of controller 701 comprises setpoint waveform progenitor module 712, such as in the form of computer-executable software instructions loaded and/or executing thereon and/or configured to be executing thereon. Realtime processor 706 of controller 701 comprises setpoint waveform processing module 722, such as in the form of computer-executable software instructions loaded and/or executing thereon and/or configured to be executing thereon. Realtime processor 706 may use TSP-RAM system 710 in processing and executing setpoint waveform processing module 722. Setpoint waveform progenitor module 712 is configured to send, deliver, or transmit outputs to setpoint waveform processing module 722. Setpoint waveform processing module 722 is configured to receive inputs, signals, or transmissions from setpoint waveform progenitor module 712, and perform processing based at least in part on the inputs from setpoint waveform progenitor module 712, to output full tensor setpoint waveforms based at least in part on the inputs it receives from setpoint waveform progenitor module 712.

Controller 701 comprises control module 724, which comprises TSP-RAM system 710, and is configured to receive inputs from setpoint waveform processing module 722 and to generate and output control signals to RF power amplifier 756, to drive the RF load, including match network 770 and plasma chamber 780. Controller 701 is also operably connected to setpoint control UI system 702, for setpoint waveform progenitor module 712 to receive inputs from setpoint control UI system 702, including user inputs specifying or designating waveform shapes, waveform pulsing level shapes or state shapes, points, waveform parameters, and/or other data or information indicative of one or more desired setpoint waveforms.

Setpoint control UI system 702 may comprise a computer or any other device capable of executing a setpoint control UI and enabling a user to enter user inputs indicative of a desired setpoint waveform to the setpoint control UI. The setpoint control UI may interact with a setpoint control application that may execute at least in part on the same one or more devices as setpoint control UI system 702, in the cloud, and/or any other accessible computing resources.

Control module 724 may comprise one or more of an MRAC (model reference adaptive control) control module, a PID (proportional-integral-derivative) control module comprising one or more PID modules, an MRAC-PID control module combining MRAC and PID modules and functions, a gain parametrized control module, or another type of control module, in different examples. Control module 724 may receive the setpoint waveforms streaming from setpoint waveform processing module 722, and may also receive other inputs such as error signals and system sensor readings. Control module 724 may apply intermediate operations such as error correction, if and when control module 724 determines a need to perform such an action. Control module may use TSP-RAM system 710 in generating and outputting a control signal based at least in part on the streaming setpoint waveform outputted by setpoint waveform streaming processing module 722.

Setpoint control UI system 702 enables a user to input a desired shape of an output power waveform for a plasma in a plasma reactor or other type of plasma chamber. Controller 701 may use TSP-RAM system 710 to enable the setpoint waveform to be of any shape and type, with very high resolution, such as up to eight times (8×) the sampling rate of realtime processor 706 (e.g., an FPGA), in some examples. In one illustrative example, realtime processor 706 may comprise an FPGA with a sampling speed of 100 megahertz (MHz), and the resolution of the setpoint waveform enabled by controller 701 may be 12.5 MHz. In another illustrative example of controller 701 incorporated into another example RF generator, the resolution of the setpoint waveform enabled by controller 701 may be 100 MHz. Other example controllers of this disclosure may also have values of resolution higher or lower than these examples.

Controller 701 comprising TSP-RAM system 710 may enable a user to simply input desired multi-level pulsing setpoints or multi-state setpoints with desired waveform shape and timing specifications for each state, via setpoint control UI system 702, and controller 701 may produce or generate or transmit a setpoint waveform with the multiple pulsing levels or states and in accordance with the other desired waveform shape and timing specifications for each pulsing level or state, in various examples. While some traditional example plasma processing systems, as an example application for controller 701, have requirements for one or two states or one or two level pulsing in a setpoint signal provided to a control module of a controller for the plasma processing system, some emerging example systems may have a requirement for four states or four level pulsing, which controller 701 may accommodate, thereby providing novel advantages in being able to meet requirements for up to four states. Controller 701 may also, in some examples, be upgradeable or upgraded to be able to provide, for example, up to eight or sixteen states, with a simple software parameter upgrade, with the same hardware. Controller 701 may also be capable of providing more than sixteen states or other numbers of states, in other examples. Controller 701 may use setpoint streaming with multiple desired inputs and multiple desired outputs as part of the desired setpoint waveform, and produce a corresponding multi-input multi-output (MIMO) setpoint waveform, as an intrinsic feature of its tensorized nature.

Figure 8:
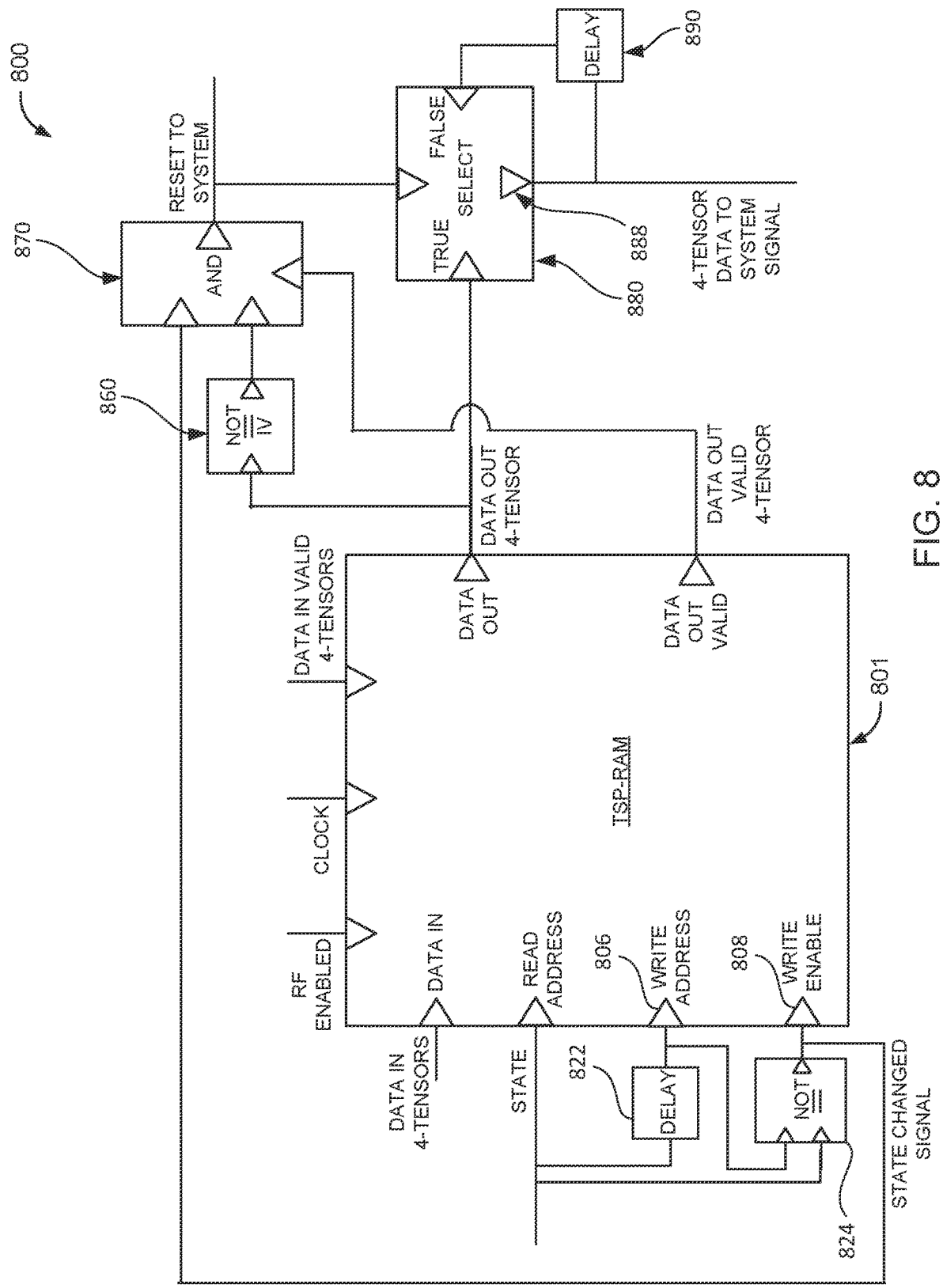
FIG. 8 illustrates an example TSP-RAM control circuit that may be particularly adapted for functioning as part of a controller of a plasma processing system, and that comprises an example TSP-RAM system, in accordance with aspects of the present disclosure.

FIG. 8 illustrates an example TSP-RAM control circuit 800 that may be particularly adapted for functioning as part of a controller of a plasma processing system, and that comprises an example TSP-RAM system 801, in accordance with aspects of the present disclosure. TSP-RAM control circuit 800 is only one illustrative example, among a great many, of an application in which an example TSP-RAM system of this disclosure may be advantageously incorporated.

TSP-RAM system 801 receives tensor input data via data in tensor line 802, and generates and outputs tensor output data via data out tensor line 822. TSP-RAM control circuit 800 processes the tensor output data outputted by TSP-RAM system 801 through further circuit components, before TSP-RAM control circuit 800 generates and outputs tensor output data on data to system signal line 842. In this example, the input data that TSP-RAM system 801 may receive via data in tensor line 802, and the output data that TSP-RAM system 801 may generate and output via data to system signal output port 888, may comprise fourth-order tensors. These fourth-order tensors may comprise one tensor each for each of four sets of data:

1. a fast/drive control values tensor;
2. a slow/rail control values tensor;
3. a match network control values tensor; and
4. a frequency tuning control values tensor.

TSP-RAM control circuit 800 comprising TSP-RAM system 801 may thus process all data needed for control of an entire complex realtime system, such as plasma processing system 700 of FIG. 7, in realtime and in its native tensor form, or in the form of its other complex data type, in various examples, and without relying on any necessarily complex, time-consuming techniques to reduce tensor data to mathematically simpler and more easily tractable data types, as in various prior art systems. TSP-RAM system 801 may be further configured to process tensors that may also further comprise theta interpolation parameters for fully configurable setpoint waveform streaming, as further described in patent application Ser. No. 17/509,539, referenced above, in various examples that further demonstrate novel advantages of systems of this disclosure. Control circuit 800 comprising TSP-RAM system 801 may thus enable novel, advantageous capabilities with precise, realtime control, and enable novel advances in the state of the art, in a wide variety of demanding, complex, realtime applications, of which plasma processing applications are one illustrative example.

While TSP-RAM control circuit 800 comprising TSP-RAM system 801 is configured to process fourth-order tensors in this illustrative example, TSP-RAM control circuits and other TSP-RAM systems of this disclosure may be configured to process tensors of any order, or vectors, matrixes, arrays, or data of any other multi-dimensional or other complex data types, in various examples. TSP-RAM control circuits and other TSP-RAM systems of this disclosure may bring various novel advantages of this disclosure to bear on those any-order tensor or other multidimensional data or other complex data processing tasks, in a variety of implementations and examples of the TSP-RAM architectures, systems, devices, techniques, and processes of this disclosure.

As particular examples within the realm of plasma processing applications such as may be applicable in plasma processing system 700 of FIG. 7, control circuit 800 comprising TSP-RAM system 801 may enable an inter-intra pulse multi-input multi-output (MIMO) control system. An inter-intra pulse MIMO control system applied in plasma processing system 700 may be applied in conjunction with a PID-MRAC control system, or with any of a wide variety of other control system implementations, including the other examples described or indicated herein.

In an illustrative example, TSP-RAM control circuit 800 may use the implemented control system (e.g., the PID-MRAC control system) to operate the first time TSP-RAM control circuit 800 is in a given state. In an illustrative example, control circuit 800 may detect when its state input has a given state for the first time. TSP-RAM control circuit 800 may compare a current state at any given time k with a selected initial value. In particular, state variance indication circuit 860 may compare the data out tensor at time k with the selected initial value. If state variance indication circuit 860 determines that the data out tensor of the data out tensor signal at time k does not match the selected initial value, state variance indication circuit 860 may generate and output an indication that the state has changed from the initial value, in a state variance indication signal. Each time TSP-RAM control circuit 800 detects that it is in a given state for the first time, TSP-RAM control circuit 800 may operate the implemented control system (e.g., the PID-MRAC control module; illustratively an implementation of control module 724 of FIG. 7).

In an illustrative example process, TSP-RAM control circuit 800 may also detect every change of state by comparing the state input variable at any given time k with the state input variable from the previous time k−1. The indexing of time index k may be done at a significantly fast sampling rate or resolution rate of TSP-RAM control circuit 800, and each indexed time interval may colloquially be referred to as an "instant" of time, such that TSP-RAM control circuit 800 may be thought of as comparing the state input variable in a current instant with the state input variable in the previous "instant." Every time TSP-RAM control circuit 800 receives a new state that TSP-RAM control circuit 800 has been into before, TSP-RAM control circuit 800 may store the current 4-tensor in that state's TSP-RAM addresses in TSP-RAM circuit 801.

In an illustrative example process, TSP-RAM control circuit 800 may also detect when it is in a state that it has been in before (e.g., its tensor TSP-RAM value does not correspond to the selected initial value), and in this case, TSP-RAM control circuit 800 may reset all of the memory components in the control module (e.g., the PID-MRAC control system) to the values of the 4-tensors stored in TSP-RAM circuit 801. This may correspond to the reset to system circuit 870 detecting logical true or positive conditions on all three of its inputs at the same time—the state change signal, the state variance signal, and the data out valid tensor signal—and responding to detecting these conditions by outputting a reset to system signal. The reset to system signal may also be used to select the data to output to the control module, e.g., the 4-tensors used to reset integrators of the PID-MRAC control module.

Reset to system circuit 870 may output the reset to system signal, e.g., a logical true signal, to select circuit 880. Select circuit 880 may then respond to receiving the logical true signal from reset to system circuit 870 by outputting a new value for its data from TSP-RAM circuit 801 to system signal output. Select circuit 880 of TSP-RAM control circuit 800 may thereby implement TSP-RAM control circuit 800 outputting a new value from TSP-RAM circuit 801 to the control module (e.g., control module 724 in FIG. 7). In time "instants" when select circuit 880 does not receive a logical true signal from reset to system circuit 870, the previously passed 4-tensor may be stored in a register in delay circuit 890, before TSP-RAM control circuit 800 implements the subsequent time "instant" or brief interval, k+1.

The output port of state change indication circuit 824 is operably coupled to the write enable input port 808 of TSP-RAM circuit 801. Thus, when the state change signal outputted from state change indication circuit 824 is set to logical true, the write enable input port 808 of TSP-RAM circuit 801 is set to logical true, TSP-RAM circuit 801 enables writing, and write address input port 806 of TSP-RAM circuit 801 receives the tensor address of the previous state (because it has gone through delay circuit 822), i.e., the state value at time k−1 (relative to a present time k).

TSP-RAM control circuit 800 comprising TSP-RAM circuit 801 may thus enable upgrading legacy controller computer code of controllers for plasma processing systems to enable multi-level pulsing, with minimal resource and timing consumption in the FPGA of the controller, as one illustrative example of novel, advantageous application of a TSP-RAM system of this disclosure, in one illustrative example. TSP-RAM systems of this disclosure are also intrinsically well-suited to deliver novel advantageous performance in many complex applications including any application of tensor processing, including machine learning/artificial intelligence (ML/AI) applications, and distributed computing/swarm applications, in various examples.

Figure 9:
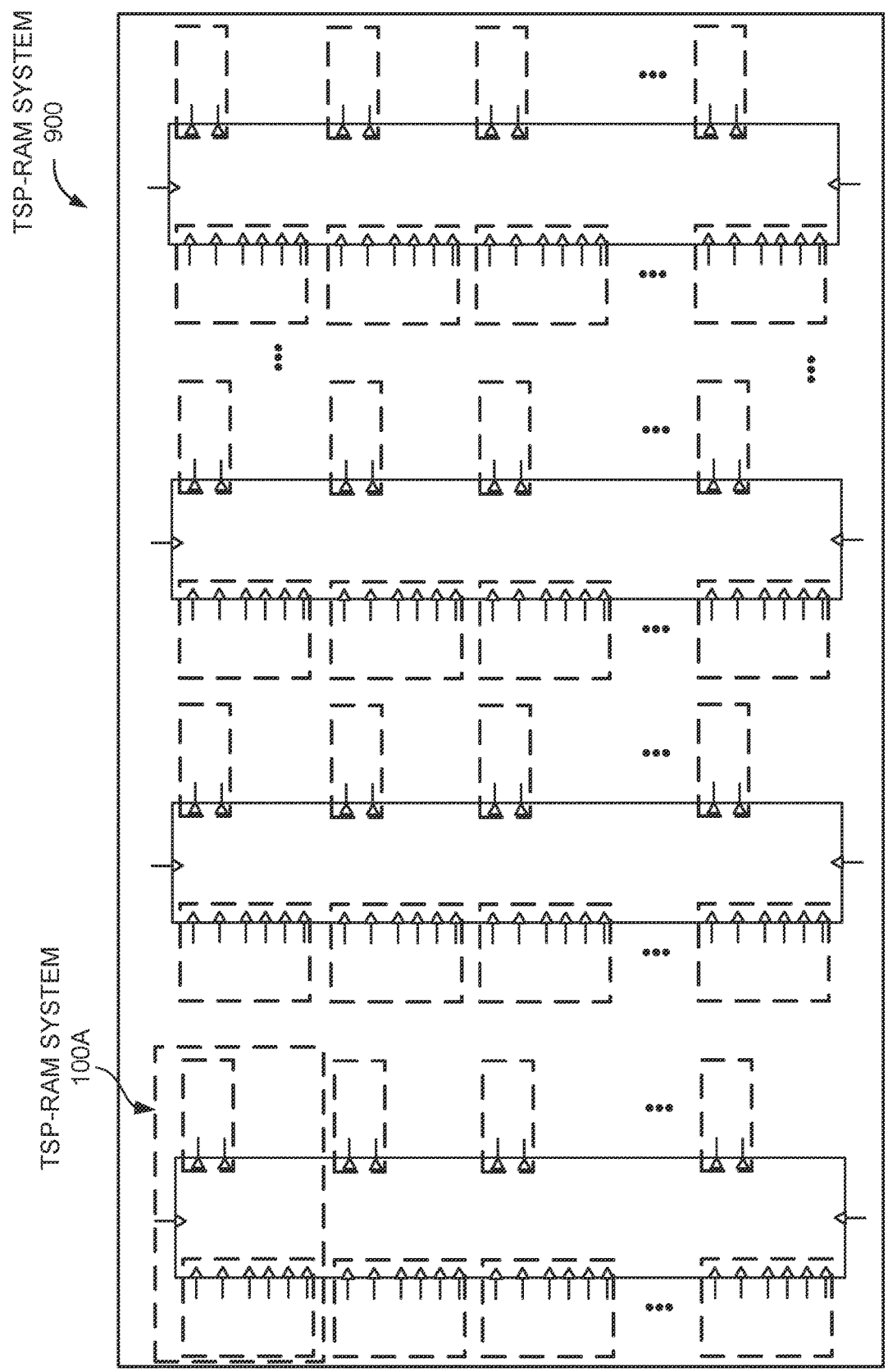
FIG. 9 illustrates an example TSP-RAM system, in accordance with aspects of the present disclosure.

FIG. 9 illustrates an example TSP-RAM system 900, in accordance with aspects of the present disclosure. As depicted in the example of FIG. 9, TSP-RAM system 900 comprises TSP-RAM system 100A, which is analogous to TSP-RAM system 100 of FIG. 1, along with many other indexed iterations of TSP-RAM system units, each of which is also analogous to TSP-RAM system 100 of FIG. 1. As depicted with various ellipses in FIG. 9, many other iterations of individual TSP-RAM system units, which are omitted from this view, may be repeated in the intervals between those individual TSP-RAM units that are depicted in the conceptual diagram of FIG. 9. TSP-RAM system 900 may comprise two or more copies of TSP-RAM system 100 as shown in FIG. 1, or two or more identical or analogous circuits as TSP-RAM system 100, and up to very large numbers of processing circuits that embody or are analogous to TSP-RAM system 100. In various examples, TSP-RAM system 900 may comprise tens, hundreds, thousands, millions, billions, trillions, or any other numbers or orders of magnitude of numbers of processing circuits identical or analogous to TSP-RAM system 100. Each copy, iteration, or identical or analogous circuit of TSP-RAM system 100 comprised in TSP-RAM system 900 may comprise any number of sets of input ports and output ports. Each set of input ports of each individual iteration of TSP-RAM system 100 comprised in TSP-RAM system 900 may comprise its own data in input port, data in valid input port, write address input port, write enable input port, read address input port, and read enable input port. Each set of output ports of each individual iteration of TSP-RAM system 100 comprised in TSP-RAM system 900 may comprise its own data out output port and its own data out valid output port. Various copies or iterations of TSP-RAM system 100 comprised in TSP-RAM system 900 may also comprise additional ports or other components. TSP-RAM system 900 may also comprise other partially analogous circuits that do not comprise all the elements of the particular illustrative examples of TSP-RAM system 100 as shown and described elsewhere in this disclosure, in various examples. TSP-RAM system 900 may further comprise additional circuits and other components, in various examples.

Figure 10:
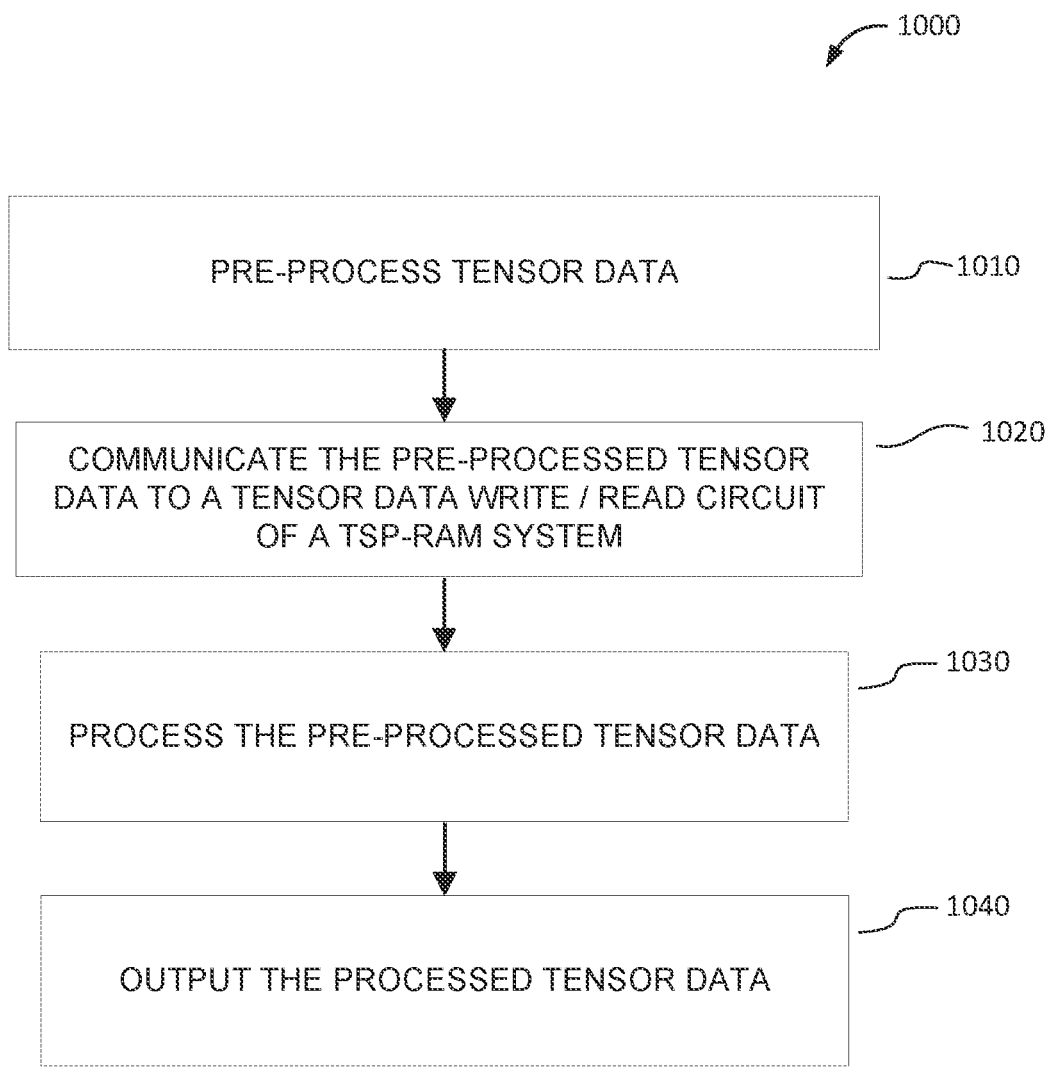
FIG. 10 depicts a flowchart for an example method for operation of a TSP-RAM system, in various aspects of the present disclosure.

FIG. 10 depicts a flowchart for an example method 1000 for operation of a TSP-RAM system, in various aspects of the present disclosure. Method 1000 comprises pre-processing, by a tensor data pre-processing circuit of a tensor non-linear signal processing random access memory (TSP-RAM) system, tensor data (1010). Method 1000 further comprises communicating, by the tensor data pre-processing circuit, the pre-processed tensor data to a tensor data write/read circuit of the TSP-RAM system (1020). Method 1000 further comprises processing, by the tensor data write/read circuit, the pre-processed tensor data (1030). Method 1000 further comprises outputting, by the tensor data write/read circuit, the processed tensor data (1040). Method 1000 may be performed by one or more modules or applications executed by or on one or more FPGAs or other realtime processors, or other modules, applications, processors, devices, or systems, in various examples.

Various examples of this disclosure may be in the form of a system, a method, a computer program product, and/or other forms. An example computer program product may comprise a computer-readable storage medium (or media) having computer-readable program instructions thereon for causing a processor to carry out aspects of embodiments of this disclosure.

An example computer-readable storage medium can be a tangible device that can retain and store instructions for use by an instruction execution device. An example computer-readable storage medium may be or comprise, for example, but is not limited to, an electronic storage device, a magnetic storage device, an optical storage device, an electromagnetic storage device, a semiconductor storage device, any suitable combination of the foregoing, any other type of storage device, or any combination of any of the foregoing with any other system. A non-exhaustive list of more specific examples of the computer-readable storage medium may comprise at least the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including object-oriented programming languages such as C++ or Java; imperative programming languages, such as C; a specialized language such as hardware description language (HDL); Lisp programming languages, such as Common Lisp, Racket, or Clojure; other functional programming languages, such as Haskell or Erlang; or multi-paradigm languages, such as Python or Rust. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to a user's computer through any type of network, including a local area network (LAN) or a wide area network (WAN), or the connection may be made to an external computer (for example, through the Internet using an Internet Service Provider (ISP)). In some embodiments, electronic circuitry including, for example, programmable logic circuitry, field-programmable gate arrays (FPGA), or programmable logic arrays (PLA) may execute computer-readable program instructions by utilizing state information of the computer-readable program instructions to personalize the electronic circuitry, in order to perform aspects of embodiments of this disclosure.

Aspects of the present disclosure are described herein with reference to flowchart illustrations and/or block diagrams of methods, apparatus (systems), and computer program products according to examples of the disclosure. Each block of the flowchart illustrations and/or block diagrams, and combinations of blocks in the flowchart illustrations and/or block diagrams, may be implemented by computer-readable and/or computer-executable program instructions.

These computer-readable and/or computer-executable program instructions may be provided to one or more processors of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable and/or computer-executable program instructions may also be stored in a computer-readable storage medium that can direct a computer, a programmable data processing apparatus, and/or other devices to function in a particular manner, such that the computer-readable storage medium having instructions stored thereon comprises an article of manufacture that comprises instructions which implement aspects of the function/act specified in the flowchart and/or block diagram block or blocks. The computer-readable and/or computer-executable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions, acts, or steps specified in the flowchart and/or block diagram block or blocks.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some implementations, the functions noted in the block may occur in a different order than that noted in the figures. For example, two blocks shown in succession in a particular example depicted in a particular figure may, in fact, be executed substantially concurrently, or the blocks may sometimes be executed in the reverse order, or in an overlapping order, depending upon the functionality involved. Each block of the block diagrams and/or flowchart illustration, and combinations of blocks in the block diagrams and/or flowchart illustration, may also be implemented by special purpose hardware-based systems that perform the specified functions or acts or carry out combinations of special purpose hardware and computer instructions.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Persons of skill in the relevant fields of art may implement the described functionality in varying ways for each particular application, but any such particular implementation decisions and details do not cause, constitute, or imply a departure from the scope of the present invention.

The various illustrative logical blocks, modules, and circuits described in connection with the embodiments disclosed herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, or any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Method 1000 and other methods of this disclosure may include other steps or variations in various other embodiments. Some or all of any of method 1000 may be performed by or embodied in hardware, and/or performed or executed by a controller, a CPU, an FPGA, a SoC, a measurement and control multi-processor system on chip (MPSoC), which may include both a CPU and an FPGA, and other elements together in one integrated SoC, or other processing device or computing device processing executable instructions, in controlling other associated hardware, devices, systems, or products in executing, implementing, or embodying various subject matter of the method.

TSP-RAM systems, devices, and methods are thus shown and described herein, in various foundational aspects and in various selected illustrative applications, architectures, techniques, and methods for TSP-RAM. Persons skilled in the relevant fields of art will be well-equipped by this disclosure with an understanding and an informed reduction to practice of a wide panoply of further applications, architectures, techniques, and methods for TSP-RAM encompassed by the present disclosure and by the claims set forth below.

As used herein, the recitation of "at least one of A, B and C" is intended to mean "either A, B, C or any combination of A, B and C." The descriptions of the disclosed examples are provided to enable any person skilled in the relevant fields of art to understand how to make or use the subject matter of the present disclosure. Various modifications to these embodiments will be readily apparent to those skilled in the art based on the present disclosure, and the generic principles defined herein may be applied to other examples without departing from the spirit or scope of the disclosure. Thus, the present disclosure is not limited to the embodiments shown herein but is to be accorded the widest scope consistent with the principles and novel features disclosed herein.

The present disclosure and many of its attendant advantages will be understood by the foregoing description, and various changes may be made in the form, construction, and arrangement of the components without departing from the disclosed subject matter or without sacrificing all of its material advantages. The form described is merely explanatory, and the following claims encompass and include a wide range of embodiments, including a wide range of examples encompassing any such changes in the form, construction, and arrangement of the components as described herein.

While the present disclosure has been described with reference to various examples, it will be understood that these examples are illustrative and that the scope of the disclosure is not limited to them. All subject matter described herein are presented in the form of illustrative, non-limiting examples, and not as exclusive implementations, whether or not they are explicitly called out as examples as described. Many variations, modifications, and additions are possible within the scope of the examples of the disclosure. More generally, examples in accordance with the present disclosure have been described in the context of particular implementations. Functionality may be separated or combined in blocks differently in various examples of the disclosure or described with different terminology, without departing from the spirit and scope of the present disclosure and the following claims. These and other variations, modifications, additions, and improvements may fall within the scope of the disclosure as defined in the claims that follow.

What is claimed is:

1. A system comprising:
a tensor data pre-processing circuit configured to receive tensorized input data associated with an amplifier, the tensorized input data comprising, at least, a drive control values tensor, a rail control values tensor, and frequency tuning control values tensor; and
a tensor data write/read circuit configured to generate tensor outputs comprising, at least, a corresponding drive control values tensor, a corresponding rail control values tensor, and a corresponding frequency tuning control values tensor,
wherein one or more output ports of the tensor data pre-processing circuit are operably coupled to one or more input ports of the tensor data write/read circuit, wherein the tensorized input data and the tensor outputs have a same number of dimensions; and
a controller configured to receive the tensor outputs and to produce, responsive to the tensor outputs, control signals to control the amplifier.

2. The system of claim 1, wherein the tensor data write/read circuit comprises a random access memory (RAM) circuit for performing multi-dimensional digital signal processing in a plurality of dimensions, wherein the plurality of dimensions corresponds to the number of dimensions of the tensorized input data and the number of dimensions of the tensor outputs.

3. The system of claim 2, wherein the tensor data write/read circuit is configured to:
receive one or more full data in inputs;
receive one or more full write enable inputs;
receive one or more write and/or read addresses;
output one or more data out outputs; and
output one or more data out valid outputs.

4. The system of claim 3, wherein the tensor data write/read circuit further comprises:
a RAM tensor adaptor circuit; and
a select by index circuit,
wherein the RAM tensor adaptor circuit comprises the RAM circuit, and is configured to output one or more read out outputs to the select by index circuit, and
wherein the select by index circuit is configured to:
receive the one or more read out outputs from the RAM processing circuit;
receive one or more read address inputs; and
output the one or more data out outputs.

5. The system of claim 1, wherein the tensor data pre-processing circuit comprises:
a select tensor write enable and data in algorithm processing circuit,
wherein one or more output ports of the select tensor write enable and data in algorithm processing circuit are operably coupled to one or more input ports of the tensor data write/read circuit.

6. The system of claim 5, wherein the select tensor write enable and data in algorithm processing circuit is configured to:
receive one or more write enable tensor inputs;
receive one or more write enable initialization data sets;
receive a condition indicative input that indicates whether or not a not enable edge condition and a data valid condition are both fulfilled;
in response to the condition indicative input indicating that the not enable edge condition and the data valid condition are both fulfilled, output one or more full write enable outputs based at least in part on the one or more write enable tensor inputs; and
in response to the condition indicative input indicating that the not enable edge condition and the data valid condition are not both fulfilled, output the one or more write enable initialization data sets.

7. The system of claim 5, wherein the select tensor write enable and data in algorithm processing circuit is configured to:
receive one or more data in tensor inputs;
receive one or more data in initialization data sets;
receive a condition indicative input that indicates whether or not a not enable edge condition and a data valid condition are both fulfilled;
in response to the condition indicative input indicating that the not enable edge condition and the data valid condition are both fulfilled, output one or more full data in outputs based at least in part on the one or more data in tensor inputs; and
in response to the condition indicative input indicating that the not enable edge condition and the data valid condition are not both fulfilled, output the one or more data in initialization data sets.

8. The system of claim 5, wherein the tensor data pre-processing circuit further comprises:
a tensor write enable and data in formation algorithm processing circuit,
wherein one or more output ports of the tensor write enable circuit and data in formation algorithm processing circuit are operably coupled to one or more input ports of the select tensor write enable and data in algorithm processing circuit.

9. The system of claim 8, wherein the tensor write enable and data in formation algorithm processing circuit is configured to:
receive write enable inputs;
perform n-dimensional tensor assignment to the write enable inputs, thereby generating n-dimensional write enable tensor outputs based at least in part on the write enable inputs; and
output the n-dimensional write enable tensor outputs.

10. The system of claim 8, wherein the tensor write enable and data in formation algorithm processing circuit is configured to:
receive data in inputs;
perform n-dimensional tensor assignment to the data in inputs, thereby generating n-dimensional data in tensor outputs based at least in part on the data in inputs; and
output the n-dimensional data in tensor outputs.

11. The system of claim 5, wherein the tensor data pre-processing circuit further comprises:
an edge enable algorithm processing circuit,
wherein one or more output ports of the edge enable algorithm processing circuit are operably coupled to one or more input ports of the select tensor write enable and data in algorithm processing circuit.

12. The system of claim 1, wherein the tensor data pre-processing circuit comprises:
a data in input port;
a data in valid input port;
a write address input port;
a write enable input port;
a read address input port; and
a read enable input port,
and
wherein the tensor data write/read circuit comprises:
a data out output port; and
a data out valid output port.

13. The system of claim 1, wherein the tensor data pre-processing circuit is a first tensor data pre-processing circuit, and the tensor data write/read circuit is a first tensor data write/read circuit,
the system further comprising:
a plurality of tensor processing blocks, wherein the plurality of tensor processing blocks comprises a first tensor processing block, wherein the first tensor processing block comprises the first tensor data pre-processing circuit and the first tensor data write/read circuit,
wherein each respective tensor processing block of the plurality of tensor processing blocks comprises a respective tensor data pre-processing circuit and a respective tensor data write/read circuit.

14. The system of claim 1, further comprising:
a data in line, operably coupled to a data in input port of the tensor data pre-processing circuit;
a state input line, operably coupled to a read address input port of the tensor data pre-processing circuit;
a first delay circuit, operably coupled between the state input line, and a write address input port of the tensor data pre-processing circuit;
a state change indication circuit, configured to receive inputs from the state input line and from outputs of the delay circuit, to determine whether an input from the state input line differs from a former state of the input indicated by an output of the delay circuit, and to output a first state change indication signal to a write enable input port of the tensor data pre-processing circuit;
a state variance indication circuit, configured to receive a data out tensor signal from a data out output port of the tensor data pre-processing circuit, to determine whether the data out tensor signal varies from an initial value, and to output a state variance indication signal;
a reset circuit, configured to receive: the state change indication signal from the state change indication circuit; the state variance indication signal from the state variance indication circuit; and a data out valid tensor signal from a data out valid output port of the tensor data pre-processing circuit, wherein the reset circuit is further configured to generate a reset to system output;
a select circuit, configured to receive: a data out tensor signal from a data out output port of the tensor data pre-processing circuit, and the reset to system signal, wherein the select circuit is further configured to output a data to system tensor signal, based at least in part on the data out tensor signal; and
a second delay circuit, configured to receive the data to system tensor signal, and to output the data to system tensor signal after a delay,
wherein the select circuit is further configured to receive the data to system tensor signal from the delay circuit.

15. A method comprising:
pre-processing, by a tensor data pre-processing circuit of a tensor non-linear signal processing random access memory (TSP-RAM) system, tensor data associated with an amplifier, the tensorized input data comprising, at least, a drive control values tensor, a rail control values tensor, and frequency tuning control values tensor;
communicating, by the tensor data pre-processing circuit, the pre-processed tensor data to a tensor data write/read circuit of the TSP-RAM system comprising, at least, a corresponding drive control values tensor, a corresponding rail control values tensor, and a corresponding frequency tuning control values tensor;
processing, by the tensor data write/read circuit, the pre-processed tensor data; and
outputting, by the tensor data write/read circuit, the processed tensor data, wherein the tensor data and the processed tensor data have a same number of dimensions; and
producing, responsive to the tensor outputs, control signals to control the amplifier.

16. The method of claim 15, wherein the tensor data write/read circuit comprises a random access memory (RAM) circuit,
wherein processing the pre-processed tensor data comprises:
decomposing, by the tensor data write/read circuit, the pre-processed tensor data to one-dimensional data;
processing, by the RAM circuit, the one-dimensional data; and
generating, by the tensor data write/read circuit, processed tensor data, based at least in part on the processed one-dimensional data; and
wherein the pre-processed tensor data and the processed tensor data have a same number of dimensions.

17. The method of claim 15, further comprising:
receiving, by the tensor data pre-processing circuit, one or more write enable tensor inputs;
receiving, by the tensor data pre-processing circuit, one or more write enable initialization data sets;
receiving, by the tensor data pre-processing circuit, one or more data in tensor inputs;
receiving, by the tensor data pre-processing circuit, one or more data in initialization data sets;
receiving, by the tensor data pre-processing circuit, a condition indicative input that indicates whether or not a not enable edge condition and a data valid condition are both fulfilled;
in response to the condition indicative input indicating that the not enable edge condition and the data valid condition are both fulfilled, outputting, by the tensor data pre-processing circuit, one or more full write enable outputs based at least in part on the one or more write enable tensor inputs;
in response to the condition indicative input indicating that the not enable edge condition and the data valid condition are not both fulfilled, outputting, by the tensor data pre-processing circuit, the one or more write enable initialization data sets;
in response to the condition indicative input indicating that the not enable edge condition and the data valid condition are both fulfilled, output one or more full data in outputs based at least in part on the one or more data in tensor inputs; and
in response to the condition indicative input indicating that the not enable edge condition and the data valid condition are not both fulfilled, output the one or more data in initialization data sets.

18. An integrated circuit comprising:
a tensor data pre-processing circuit comprising a field programmable gate array and a first set of instructions to program the field programmable gate array, the tensor data pre-processing circuit configured by the first set of instructions to receive tensorized input data associated with an amplifier, the tensorized input data comprising, at least, a drive control values tensor, a rail control values tensor, and frequency tuning control values tensor; and a tensor data write/read circuit comprising a field programmable gate array and a second set of instructions to program the field programmable gate array, the tensor data write/read circuit configured to generate tensor outputs comprising, at least, a corresponding drive control values tensor, a corresponding rail control values tensor, and a corresponding frequency tuning control values tensor, wherein one or more output ports of the tensor data pre-processing circuit are operably coupled to one or more input ports of the tensor data write/read circuit wherein the tensorized input data and the tensor outputs have a same number of dimensions.

19. The integrated circuit of claim 18, wherein the tensor data write/read circuit comprises a random access memory (RAM) circuit, wherein the tensor data write/read circuit is configured to:
receive one or more full data in inputs;
receive one or more full write enable inputs;
receive one or more write and/or read addresses;
output one or more data out outputs; and
output one or more data out valid outputs, wherein the tensor data write/read circuit further comprises:
a RAM tensor adaptor circuit; and
a select by index circuit, wherein the RAM tensor adaptor circuit comprises the RAM circuit, and is configured to output one or more read out outputs to the select by index circuit, and wherein the select by index circuit is configured to:
receive the one or more read out outputs from the RAM processing circuit;
receive one or more read address inputs; and
output the one or more data out outputs.

20. The integrated circuit of claim 18, wherein the tensor data pre-processing circuit comprises:
a select tensor write enable and data in algorithm processing circuit, wherein one or more output ports of the select tensor write enable and data in algorithm processing circuit are operably coupled to one or more input ports of the tensor data write/read circuit.

\* \* \* \* \*